(12) United States Patent
Rahim et al.

(10) Patent No.: US 6,963,503 B1
(45) Date of Patent: Nov. 8, 2005

(54) EEPROM WITH IMPROVED CIRCUIT PERFORMANCE AND REDUCED CELL SIZE

(75) Inventors: Irfan Rahim, Milpitas, CA (US); Veenu Shekhar, Santa Clara, CA (US)

(73) Assignee: Altera Corporation., San Jose, CA (US)

( * ) Notice: Subject to any disclaimer, the term of this patent is extended or adjusted under 35 U.S.C. 154(b) by 59 days.

(21) Appl. No.: 10/618,280

(22) Filed: Jul. 11, 2003

(51) Int. Cl.$^7$ ............................................. G11C 16/04
(52) U.S. Cl. ........................ 365/185.18; 365/185.05; 365/185.26
(58) Field of Search ...................... 365/185.18, 185.05, 365/185.26, 185.28, 149

(56) References Cited

U.S. PATENT DOCUMENTS 5,969,992 A * 10/1999 Mehta et al. .......... 365/185.28
6,515,899 B1 * 2/2003 Tu et al. ................ 365/185.05

* cited by examiner

Primary Examiner—David Lam
(74) Attorney, Agent, or Firm—Morgan, Lewis & Bockius LLP

(57) ABSTRACT

An EEPROM cell with reduced cell size and improved circuit performance includes a high-voltage (HV) capacitor, a low-voltage (LV) read path, and an HV write path, wherein either the HV capacitor is placed between the LV read path and the HV write path or the HV write path is placed between the LV read path and the HV capacitor. The EEPROM cell also includes a native floating-gate (FG) transistor in the LV read path. Using a native FG transistor in the LV read path results in further reduction in the cell size and improved circuit performance of the EEPROM cell.

27 Claims, 6 Drawing Sheets

FIG. 1

EEPROM WITH IMPROVED CIRCUIT PERFORMANCE AND REDUCED CELL SIZE

BACKGROUND OF THE INVENTION

Computerized systems, from simple appliances to complex networks, contain many different parts, such as displays, keyboards, mice, printed circuit boards, drives, switches, modems, processors, and memory, etc. Memory is capable of retaining digital information under certain conditions. The retained information might be operational code or data files, or a combination of the two. An ideal memory subsystem optimizes density, preserves critical information in a nonvolatile condition, is easy to program and reprogram, can be read fast, and is cost-effective for a specific application.

Electrically erasable and programmable read-only memory (EEPROM) is a nonvolatile memory that allows a user to electrically program and erase information. An EEPROM memory device typically includes EEPROM memory cells arranged in an array and peripheral circuits around the array for accessing the memory cells for program or erase operations. The capacity of an EEPROM memory device, i.e., the amount of information the memory device is capable of storing, is typically associated with the number of memory cells in the memory device. But a larger number of memory cells in a memory device also means a larger size for the memory device and possibly slower circuit performance. Therefore, smaller EEPROM cells are generally desired, and much effort has been made to create innovative EEPROM cell designs in order to produce EEPROM memory devices with large capacity, small size, and good circuit performance.

SUMMARY OF THE INVENTION

The present invention provides an EEPROM cell with smaller cell size and improved circuit performance compared with prior art EEPROM cells. In one embodiment of the present invention, each EEPROM comprises a high-voltage (HV) capacitor, a low-voltage (LV) read path, and an HV write path. To minimize the area the EEPROM cell occupies on a semiconductor substrate, either the HV capacitor is placed between the LV read path and HV write path or the HV write path is placed between the LV read path and the HV capacitor. In another embodiment of the present invention, the area of the EEPROM cell is further minimized by using a native floating-gate (FG) transistor in the LV read path. Using a native FG transistor in the LV read path not only reduces EEPROM cell size but also improves circuit performance of the EEPROM cell.

DESCRIPTION OF THE DRAWINGS

For a more complete understanding of the present invention and advantages thereof, reference is now made to the following description taken in conjunction with the accompanying drawings, in which:

FIG. 1 is a block diagram illustrating a portion of an exemplary EEPROM array;

DETAILED DESCRIPTION OF THE INVENTION

Figure 1:
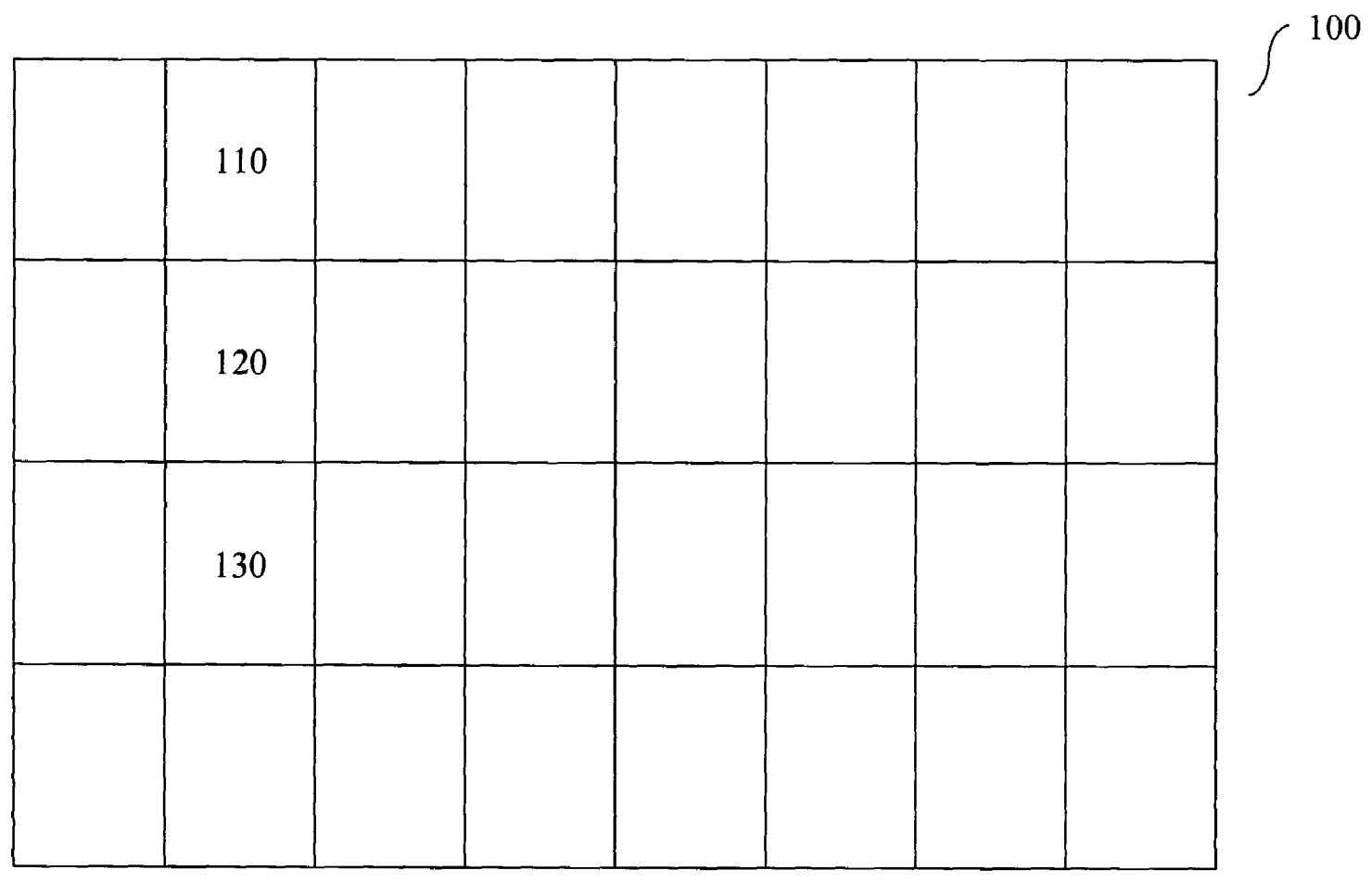

The present invention provides an EEPROM cell with reduced cell size and improved circuit performance compared with prior art EEPROM cells. In one embodiment of the present invention, the EEPROM cell is suitable for use in an EEPROM array of an EEPROM memory device. FIG. 1 schematically depicts a portion of an EEPROM array comprising EEPROM cells 110, 120, 130, etc., arranged in an array on a semiconductor substrate. The cells are interconnected by diffusion regions in the substrate and/or by conductive lines on the substrate.

Figure 2:
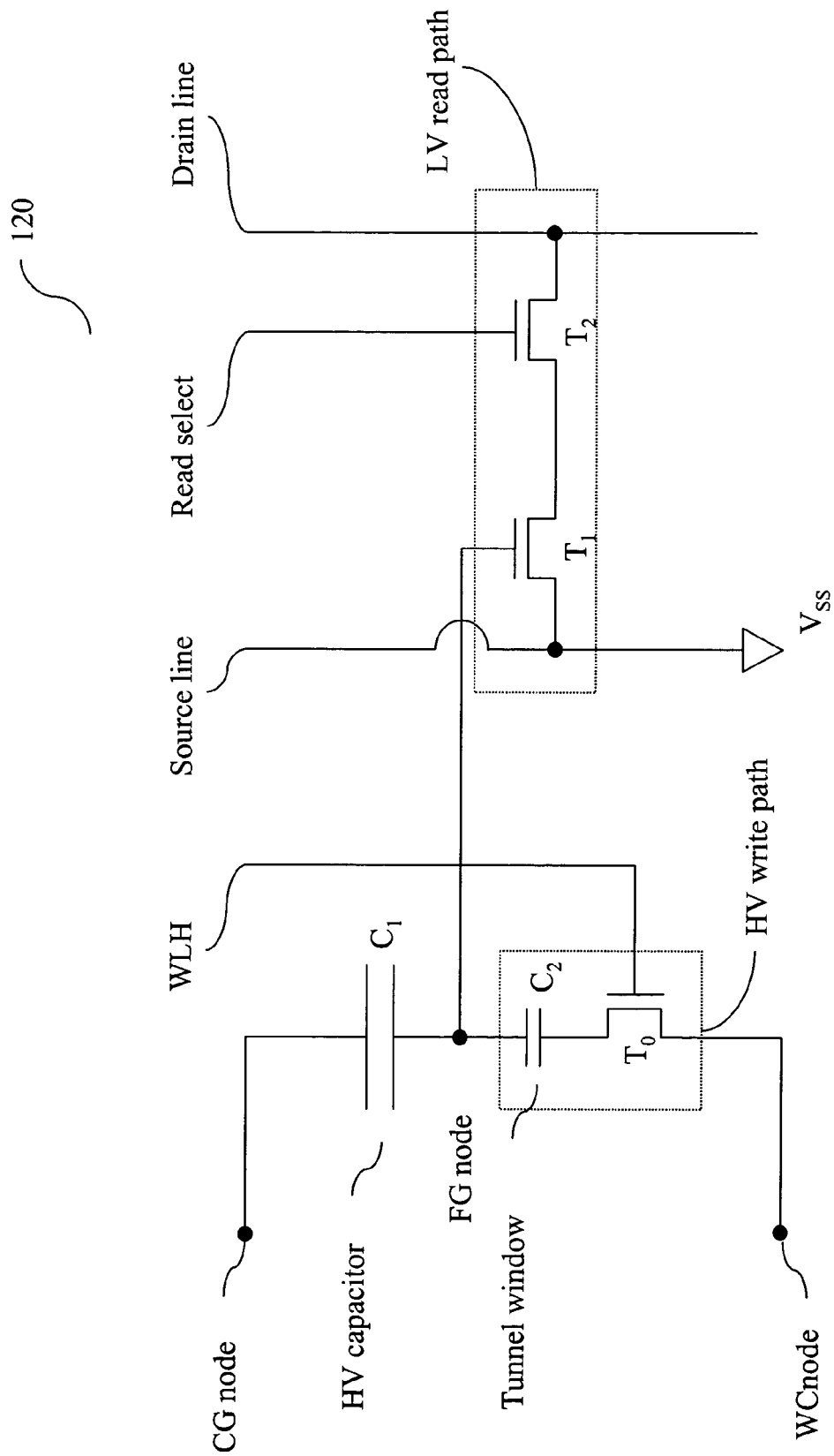
FIG. 2 is a schematic diagram of an EEPROM cell according to one embodiment of the present invention.

A circuit schematic diagram of an illustrative EEPROM cell 120 of the present invention in the array 100 is shown in FIG. 2. Cell 120 comprises a high voltage (HV) capacitor $C_1$, a tunnel capacitor $C_2$ and a high-voltage write line (WLH) transistor $T_0$. Tunnel capacitor $C_2$ includes a tunnel window allowing electrons to tunnel through capacitor $C_2$ when a sufficient voltage is applied across capacitor $C_2$. The capacitance of the HV capacitor $C_1$ is much larger than the capacitance of the tunnel capacitor $C_2$. The tunnel capacitor $C_2$ and the WLH transistor $T_0$ together form a HV write path of EEPROM cell 120.

Cell 120 further includes two serially connected metal-oxide-silicon (MOS) transistors, an FG transistor $T_1$ and a read select transistor $T_2$, together forming an LV read path of cell 120. Conductive lines, such as a high voltage write line (WLH), a drain line, a read select line, and a source line, interconnect cell 120 with other cells in the array 100.

The HV capacitor $C_1$ is coupled between a control gate node (CG node) and a floating gate (FG) node. The tunnel capacitor is coupled between the FG node and the WLH transistor $T_0$. The WLH transistor $T_0$ can be a N-type MOS (NMOS) transistor with its gate connected to the WLH, its source connected to a write control node (WC node), and its drain connected to the tunnel capacitor $C_2$. The FG transistor $T_1$ can be a NMOS transistor with a floating gate connected to the FG node, a source connected to the source line and a drain connected to a source of the read select transistor $T_2$. The read transistor $T_2$ can be a NMOS transistor with its gate connected to the read select line and its drain connected to the drain line.

Programming of cell 120 occurs when a program voltage, such as 14 V with respect to ground (or $V_{SS}$), is applied to the WC node and to the gate of the WLH transistor $T_0$ through the WLH line while the CG node is connected to ground (or $V_{SS}$). Because the capacitance of capacitor $C_1$ is much greater than the capacitance of capacitor $C_2$, most of the program voltage appears across the tunnel capacitor $C_2$, causing electrons to tunnel from the FG node through the tunnel window of capacitor $C_2$ toward the WC node, resulting in the FG node being positively charged after programming.

Since the FG node is also connected to the gate of FG transistor $T_1$, the threshold voltage of FG transistor $T_1$ is altered from its natural state when cell 120 is programmed. Cell 120 can be read or sensed using a read operation, during which a regular logic voltage (or $V_{CC}$), such as 3 V with respect to ground (or $V_{SS}$), is applied to the gate of read transistor $T_2$ via the read select line and to the drain of read transistor $T_2$ via the drain line, causing $T_2$ to conduct. Also during the read operation, the WC node is connected to ground (or $V_{SS}$) and the WLH line is connected to $V_{CC}$. Thus, whether cell 120 is programed or not can be sensed or read by noting the level of voltage that needs to be placed on the CG node until $T_1$ conducts so that a read current ($I_{cell}$) is sensed through the read path via the drain line. The threshold voltage of FG transistor $T_1$ when cell 120 is programmed is sometimes referred to as a program margin of cell 120.

The amount of read current ($I_{cell}$) sensed when an EEPROM cell in array 100 is programmed depends on the source-drain resistance of transistor $T_1$ and that of transistor $T_2$ in the EEPROM cell. Since the source-drain resistance of transistor $T_1$ in a programmed EEPROM cell is dependent on the program margin of the cell, which typically varies from cell to cell in the EEPROM array 100, the amount of read current ($I_{cell}$) of a programmed EEPROM cell may also vary from cell to cell in array 100. The variation of $I_{cell}$ from cell to cell in array 100 results in variation in a speed of sensing a programmed cell in array 100, which is generally not desired for an EEPROM array. To avoid the sense speed variation in array 100, the read current of each programmed cell in array 100 needs to be insensitive to variations of program margins of the cells. One way of achieving this goal is to make the read transistor $T_2$ current limiting in the read path of each EEPROM cell in array 100. This requires the source-drain resistance of $T_2$ to be significantly higher than the source-drain resistance of T.

Figure 3:
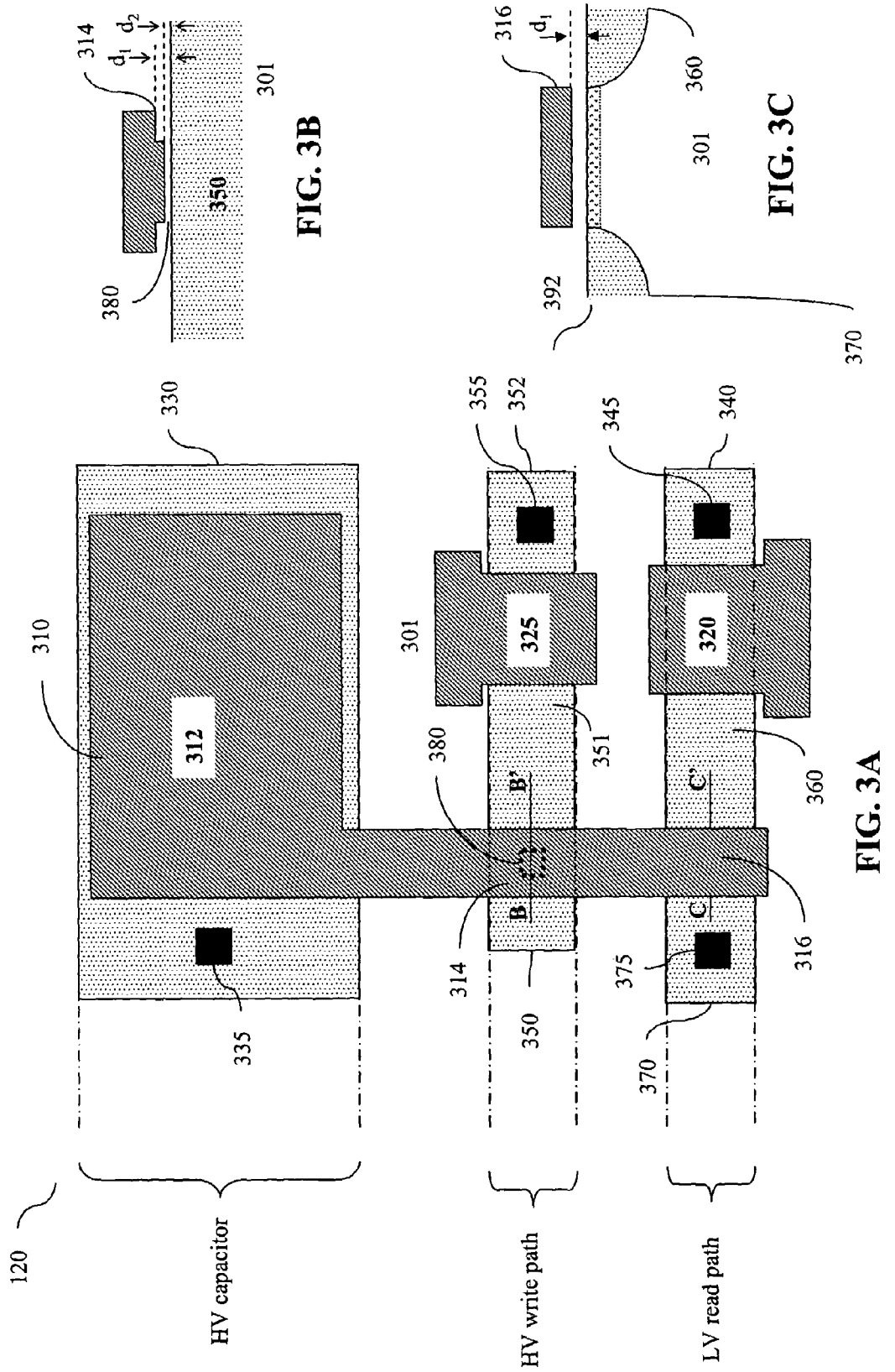
FIGS. 3A–3C are block diagrams illustrating an EEPROM cell according to one embodiment of the present invention.

Cell 120 can be fabricated on a semiconductor (such as silicon) substrate. FIG. 3A illustrates a layout of EEPROM cell 120 on a semiconductor substrate 301, according to one embodiment of the present invention. Referring to FIG. 3A, the layout of cell 120 includes diffusion regions in substrate 301 for the HV capacitor, the LV read path, and the HV write path. The diffusion region for the HV write path is between those of the HV capacitor and the LV read path. In an alternative embodiment that is not shown, the diffusion region for the HV capacitor could be between those of the HV write path and the LV read path. The FG node of cell 120 is represented by a conductive plate 310 on top of substrate 301. Most of the conductive plate 310 is separated from substrate 301 by a first dielectric layer (not shown) having a first thickness, $d_1$.

The HV capacitor $C_1$ is realized by a first portion 312 of conductive plate 310 that is on top of a HV capacitor diffusion region 330 in substrate 301 and that is separated from diffusion region 330 by the first dielectric layer. A contact 335 in diffusion region 330 connects the diffusion region with the CG node in FIG. 2.

The HV write path includes the tunnel capacitor $C_2$ and the WLH transistor $T_0$. The tunnel capacitor $C_2$ is realized by a second portion 314 of conductive plate 310 on top of a HV write diffusion region 350 in the HV write path. FIG. 3B is a vertical cross section along line B–B' in FIG. 3A illustrating the tunnel capacitor $C_2$. As shown in FIG. 3B, under part of the second portion 314 of conductive plate 310 is a tunnel window 380. In tunnel window 380, the conductive plate 310 is separated from diffusion region 350 by a tunnel dielectric layer (not shown) having a second thickness, $d_2$, which is much thinner than the thickness, $d_1$, of the first dielectric layer, making it possible for electrons to tunnel through the tunnel window 380 when cell 120 is being programmed.

The WHL transistor is realized by a conductive gate 325, which is separated from substrate 301 by a third dielectric layer having a third thickness, $d_3$, and by two diffusion regions 351 and 352 on opposite sides of conductive gate 325. Diffusion regions 352 and 351 act as source and drain, respectively, of WLH transistor $T_0$, and diffusion region 352 includes a contact 355 that is connected to the WC node. Diffusion region 351 can be part of the HV write diffusion region 350, as shown in FIG. 3A.

The LV read path includes the FG transistor $T_1$ and the read transistor $T_2$. The FG transistor $T_1$ is realized by a portion 316 of conductive plate 310 on top of the LV read path and by two diffusion regions 370 and 360 on opposite sides of the portion 316 of conductive plate 310. FIG. 3C is a vertical cross-section along line C–C' in FIG. 3A illustrating FG transistor $T_1$. Portion 316 of conductive plate 310 is separated from the substrate by a dielectric layer (not having shown) having the first thickness, $d_1$. Diffusion regions 370 and 360 act as source and drain, respectively, of the FG transistor $T_1$, and diffusion region 370 includes a contact 375 that is connected to the source line. Channel region 392 is under portion 316 of plate 310.

The read transistor $T_2$ is realized by a conductive gate 320, which is separated from substrate 301 by a fourth dielectric layer (not shown) having a fourth thickness, $d_4$, and by two diffusion regions 360 and 340 on opposite sides of conductive gate 320. Diffusion regions 360 and 340 act as source and drain, respectively, of the read transistor $T_2$, and diffusion region 340 includes a contact 345 that is connected to the drain line.

In one embodiment of the present invention, the thickness $d_1$, $d_3$ of the first or third dielectric layer is about 200 Å, the thickness $d_2$ of the second dielectric layer is about 96 Å, and the thickness $d_4$ of the fourth dielectric layer is about 35 Å. All of the diffusion regions in cell 120 can be n-type diffusion region formed at a surface of substrate 301 facing the conductive plate 310 and gates 320 and 325. Conductive gate 320 is electrically connected to the read select line in FIG. 2, and conductive gate 325 is electrically connected to the WLH line in FIG. 2.

Figure 4:
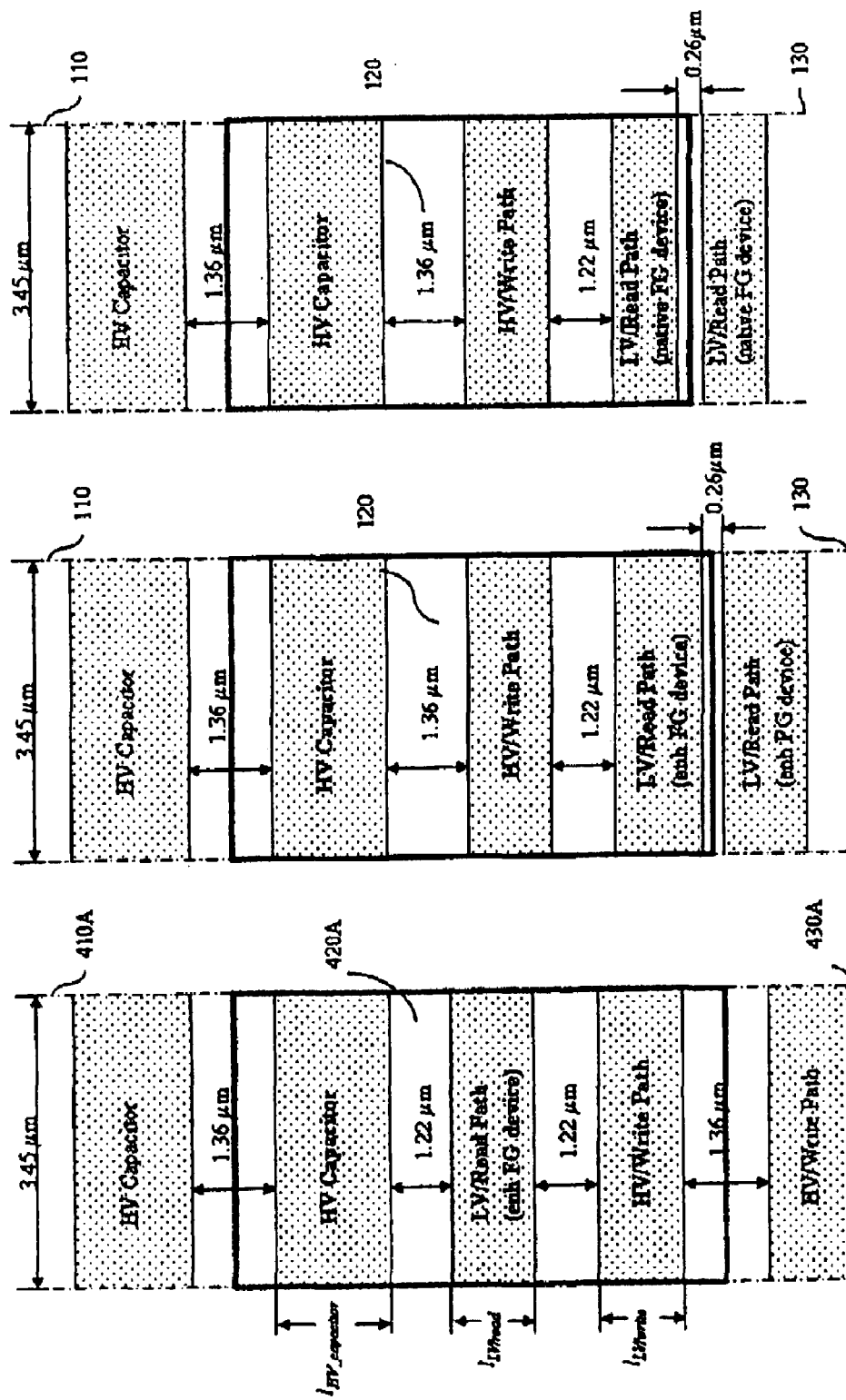
FIG. 4A is a block diagram illustrating a layout of diffusion areas in a prior art EEPROM cell.
FIG. 4B is a block diagram illustrating a layout of diffusion areas in an EEPROM cell according to one embodiment of the present invention.
FIG. 4C is a block diagram illustrating a layout of diffusion area in an EEPROM cell according to an alternative embodiment of the present invention.

The layout of EEPROM cell 120 as shown in FIG. 3A allows cell 120 to be smaller in size than conventional EEPROM cells. FIG. 4A shows three diffusion regions of a conventional EEPROM cell 420A corresponding respectively to a HV capacitor, a LV read path, and a HV write path of the conventional EEPROM cell 420A. FIG. 4A also shows portions of conventional EEPROM cells 410A and 430A adjacent cell 420A in a conventional EEPROM array. In conventional cells 410A, 420A, and 430A, the LV read path is placed between the HV capacitor and the HV write path. To avoid punch through, relatively wide spacings must be maintained between a diffusion region associated with a high voltage device, such as the HV capacitor or devices in the HV write path, and other diffusion regions. In contrast, a much narrower spacing is required between diffusion regions associated with low voltage devices, such as those in the LV read path.

The spacings between various diffusion regions in a semiconductor device are usually governed by design rules.

For examples, a set of design rules may require that: (1) a minimum spacing of 1.36 μm be maintained between diffusion regions of two HV capacitors or two HV write paths, or between diffusion regions of an HV capacitor and an HV write path; (2) a minimum spacing of 1.22 μm be maintained between a diffusion region of an LV read path and a diffusion region of an HV capacitor or HV write path; and (3) a minimum spacing of 0.26 μm be maintained between diffusion regions of two LV/read paths. As shown in FIG. 4A, such a design rule would require that the LV read path in cell 420A be separated from the HV capacitor and the HV/write path by a minimum of 1.22 μm, and that the HV capacitor or the HV/write path of cell 420A be separated from the HV capacitor of cell 410A or the HV/write path of cell 430A, respectively, by at least 1.36 μm. Assuming the width of cell 420A is 3.45 μm, as shown in FIG. 4A, the layout of cell 420A would require that:

$$\text{Minimum area of cell } 420A = 3.45 \, \mu\text{m} \times (l_{HV\_capacitor} + l_{LV/read} + l_{HV/write} + 3.80 \, \mu\text{m})$$

where $l_{HV\_capacitor}$, $l_{LV/read}$, and $l_{HV/write}$ are widths of the diffusion regions of the HV capacitor, LV read path, and HV write path, respectively, as shown in FIG. 4A.

The inventors of the present invention have found that, while still based on the same set of design rules, the layout of EEPROM cell 120 as shown in FIG. 3A can significantly reduce the EEPROM cell area. As shown in FIG. 3A, the HV write path of cell 120 is placed between the HV capacitor and the LV read path of cell 120. This is also illustrated in FIG. 4B, which shows diffusion regions of EEPROM cell 120 and portions of adjacent cells 110 and 130 according to one embodiment of the present invention. As shown in FIG. 4B, by placing the LV read path close to an edge of the EEPROM cell, instead of between the HV capacitor and the HV/write path, the layout of cell 120 would require that:

$$\text{Minimum area of cell } 120 = 3.45 \, \mu\text{m} \times (l_{HV\_capacitor} + l_{LV/read} + l_{HV/write} + 3.39 \, \mu\text{m}),$$

which is smaller than the minimum cell area of cell 420A by 1.41 μm².

In another embodiment of the present invention, the area of cell 120 can be further reduced by using a native FG transistor $T_1$ in cell 120, instead of an enhancement FG transistor typically used in a conventional EEPROM cell.

Figure 5:
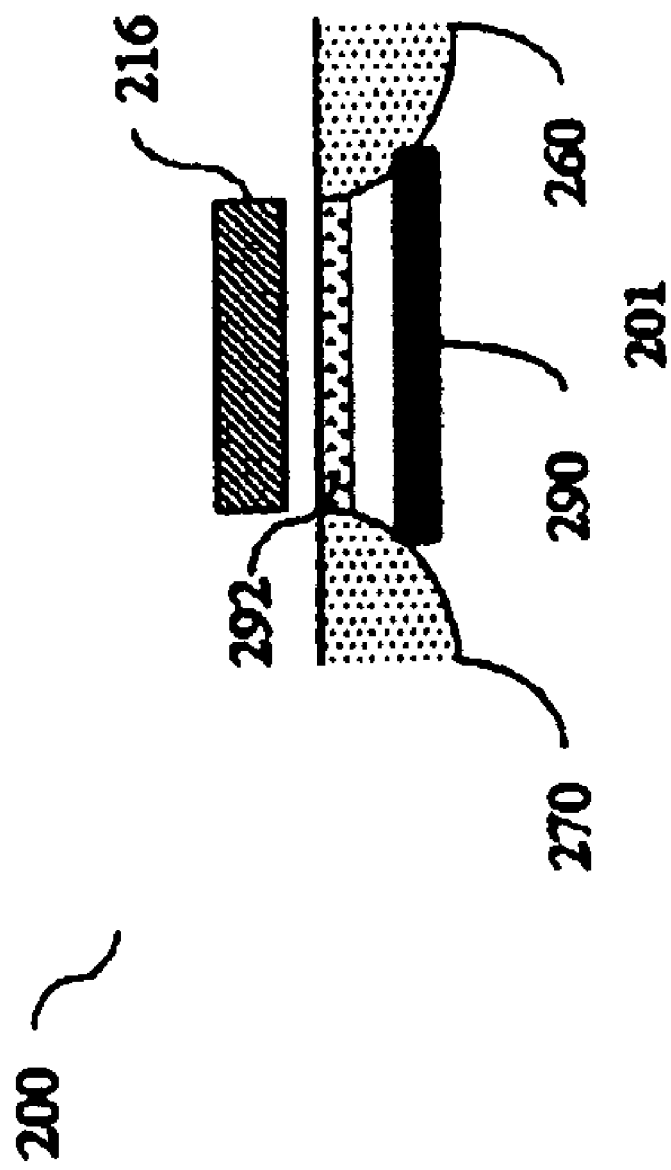
FIG. 5 is a cross-sectional view illustrating a floating gate transistor in a prior art EEPROM cell.

FIG. 5 is a block diagram illustrating in vertical cross section a FG transistor 200 in a conventional EEPROM cell. As shown in FIG. 5, the FG transistor 200 in the conventional EEPROM cell is an enhancement FG transistor having source and drain regions 270, 260, channel region 292 under gate 216, and a buried p-type diffusion region (or enhancement implant) 290 that lies in substrate 201 under channel region 292. In contrast, as shown in FIG. 3C, a native transistor does not have a buried p-type diffusion under the channel region. The buried p-type diffusion region 290 is typically formed with a deep p+ or p++implant into substrate 201 and has the effect of increasing the difference of the threshold voltage of the FG transistor when the conventional EEPROM cell is programed and the threshold voltage of the FG transistor when the conventional EEPROM cell is not programed, making it easy to sense the state of the conventional EEPROM cell.

The use of an enhancement FG transistor in the conventional EEPROM cell, however, poses several disadvantages. As stated above, extra processing steps are usually required to form the enhancement implant of an enhancement FG transistor. Also, the presence of the enhancement implant 290 results in the FG transistor having a larger source-drain resistance. This can cause the FG transistor in the conventional EEPROM cell to become current limiting in the LV read path of the conventional EEPROM cell when the source-drain resistance of the FG transistor is higher than or comparable to that of a read transistor in the conventional EEPROM cell. As a result, the read current $I_{cell}$ in the read path of the conventional EEPROM cell becomes sensitive to the source-drain resistance of the FG transistor. This is more likely to happen as the length of the read transistor shrinks with the trend to produce smaller and smaller devices, because a shorter read transistor would have an even smaller source-drain resistance. As discussed above, the source-drain resistance of an FG transistor in a programmed EEPROM cell varies with the program margin of the EEPROM cell. So, when the FG transistor in the conventional EEPROM cell is current limiting in the LV read path, $I_{cell}$ becomes sensitive to variations of the program margin of the conventional EEPROM cell, resulting in degraded circuit performance of the EEPROM cell.

Figure 6B:
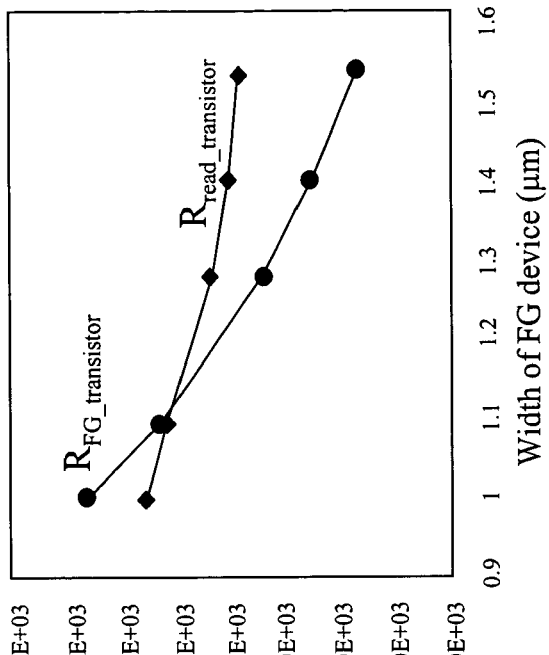
FIG. 6B is a graph showing the source-drain resistance of an LV read transistor and that of a native FG transistor versus the native FG transistor width in a read path of an EEPROM cell in one embodiment of the present invention.
Figure 6A:
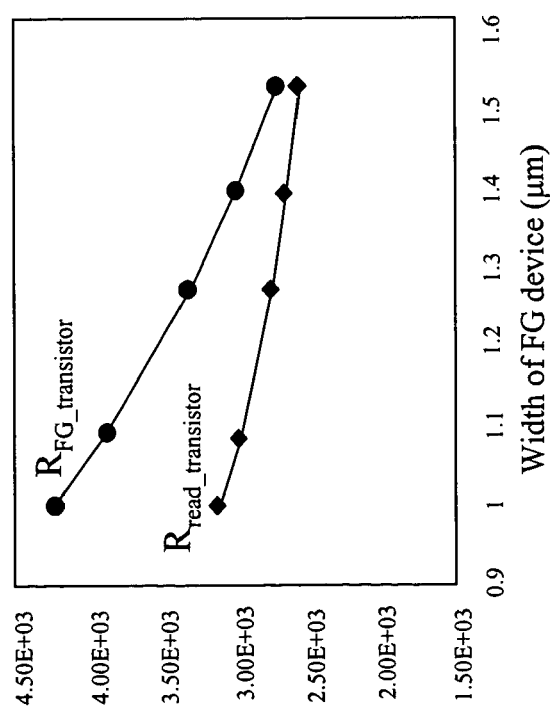
FIG. 6A is a graph showing a source-drain resistance of an LV read transistor and that of an enhancement FG transistor versus the enhancement FG transistor width in a read path of a prior art EEPROM cell.

In the conventional EEPROM cell, a greater width of the diffusion regions in the LV read path and a longer device length for the read transistor are usually used to compensate for the effects of the larger source-drain resistance of the FG transistor, resulting in the conventional EEPROM cell having a larger cell size. FIGS. 6A and 6B illustrate variations of the source-drain resistance of an FG transistor and that of a serially connected read transistor versus the width of the diffusion regions of the FG transistor, when the FG transistor is an enhancement FG device (FIG. 6A), and when the FG transistor is a native FG device (FIG. 6B). As shown in these figures, a larger width of the diffusion regions of the FG transistor is required to cause the source-drain resistance of the FG transistor to drop below that of the read transistor when the FG transistor is an enhancement FG device than when the FG transistor is a native FG device.

Therefore, using a native FG transistor in the LV read path of EEPROM cell 120 allows further reduction in the size of cell 120, as shown in FIG. 4C, where EEPROM cell 120 is shown to have an LV read path that is significantly narrower than the LV read path in cell 420A. In one embodiment of the present invention, the area of cell 120 as shown in FIG. 4C is 11% smaller than the area of conventional EEPROM cell 420A.

Although the present invention has been described in detail, it should be understood that various changes, substitutions, and alterations can be made hereto without departing from the spirit and scope of the invention as defined by the appended claims. Of particular note, it should be understood that while the invention has been described for an embodiment in which the HV write path is located between the LV read path and the HV capacitor the invention may also be practiced in an embodiment where the HV capacitor is located between the LV read path and the HV write path.

We claim:

1. A nonvolatile memory cell, comprising:
a high-voltage capacitor;
a high-voltage write path coupled to the high-voltage capacitor; and
a low-voltage read path coupled to both the high-voltage capacitor and the high-voltage write path;
wherein the high-voltage write path is situated between the low-voltage read path and the high-voltage capacitor.

2. The nonvolatile memory cell of claim 1 wherein the low-voltage read path comprises a floating gate transistor.

3. The non-volatile memory cell of claim 2 wherein the floating gate transistor is a native floating gate transistor.

4. The nonvolatile memory cell of claim 2 wherein the low-voltage read path further comprises a read transistor.

5. The nonvolatile memory cell of claim 4 wherein the floating gate transistor and the read transistor are serially connected.

6. A nonvolatile memory cell, comprising:
a high-voltage capacitor;
a high-voltage write path coupled to the high-voltage capacitor; and
a low-voltage read path coupled to both the high-voltage capacitor and the high-voltage write path;
wherein either the high-voltage write path is situated between the low-voltage read path and the high-voltage capacitor or the high-voltage capacitor is situated between the low-voltage read path and the high-voltage write path;
wherein the low-voltage read path comprises a floating gate transistor; and
wherein the high-voltage capacitor comprises a conductive plate and a first diffusion region, wherein the conductive plate is separated from the first diffusion region by an oxide layer and is electrically connected to a floating gate of the floating gate transistor.

7. The nonvolatile memory cell of claim 6 wherein the high-voltage write path comprises a conductive plate and a second diffusion region, the conductive plate being electrically connected to the conductive plate of the high-voltage capacitor and at least a portion of the conductive plate being separated from the second diffusion region by a layer of tunnel oxide.

8. A nonvolatile memory cell, comprising:
a high-voltage capacitor;
a high-voltage write path coupled to the high-voltage capacitor; and
a low-voltage read path coupled to both the high-voltage capacitor and the high-voltage write path;
wherein either the high-voltage write path is situated between the low-voltage read path and the high-voltage capacitor or the high-voltage capacitor is situated between the low-voltage read path and the high-voltage write path;
wherein the low-voltage read path comprises a floating gate transistor and a read transistor serially connected to the floating gate transistor; and
wherein a diffusion region of the read transistor is electrically connected to a diffusion region of the floating gate transistor.

9. A nonvolatile memory cell comprising:
a high-voltage capacitor;
a high-voltage write path coupled to the high-voltage capacitor; and
a low-voltage read path coupled to both the high-voltage capacitor and the high-voltage write path;
wherein either the high-voltage write path is situated between the low-voltage read path and the high-voltage capacitor or the high-voltage capacitor is situated between the low-voltage read path and the high-voltage write path;
wherein the low-voltage read path comprises a floating gate transistor and a read transistor: and
wherein the read transistor is significantly more resistive than the floating gate transistor when a read current runs serially through channels of the read transistor and the floating gate transistor.

10. A nonvolatile memory cell, comprising:
a high-voltage capacitor;
a high-voltage write path coupled to the high-voltage capacitor; and
a low-voltage read path coupled to both the high-voltage capacitor and the high voltage write path;
wherein the low-voltage read path includes a native floating gate transistor and the high-voltage write path is situated between the high-voltage capacitor and the low-voltage read path.

11. The nonvolatile memory cell of claim 10 wherein the high-voltage capacitor is situated between the low-voltage read path and the high-voltage write path.

12. The non-volatile memory cell of claim 10 wherein the high-voltage write path is situated between the low-voltage read path and the high-voltage capacitor.

13. The nonvolatile memory cell of claim 10 wherein the low-voltage read path also includes a read transistor.

14. The nonvolatile memory cell of claim 13 wherein the floating gate transistor and the read transistor are serially connected.

15. A nonvolatile memory cell comprising:
a high-voltage capacitor;
a high-voltage write path coupled to the high-voltage capacitor; and
a low-voltage read path coupled to both the high-voltage capacitor and the high voltage write path;
wherein the low-voltage read path includes a native floating gate transistor; and
wherein the high-voltage capacitor comprises a conductive plate and a first diffusion region, wherein the conductive plate is separated from the first diffusion region by an oxide layer and is electrically connected to a floating gate of the floating gate transistor.

16. The nonvolatile memory cell of claim 15 wherein the low-voltage read path comprises a conductive plate and a second diffusion region, the conductive plate being electrically connected to the conductive plate of the high-voltage capacitor and at least a portion of the conductive plate being separated from the second diffusion region by a layer of tunnel oxide.

17. A nonvolatile memory cell, comprising:
a high-voltage capacitor;
a high-voltage write path coupled to the high-voltage capacitor; and
a low-voltage read path coupled to both the high-voltage capacitor and the high voltage write path;
wherein the low-voltage read path includes a native floating gate transistor and a read transistor serially connected to the native floating transistor, and
wherein a diffusion region of the read transistor is electrically connected to a diffusion region of the floating gate transistor.

18. A nonvolatile memory cell, comprising:
a high-voltage capacitor;
a high-voltage write path coupled to the high-voltage capacitor; and
a low-voltage read path coupled to both the high-voltage capacitor and the high voltage write path;
wherein the low-voltage read path includes a native floating gate transistor and a read transistor serially connected to the native floating transistor; and
wherein the read transistor is significantly more resistive than the floating gate transistor when a read current runs serially through channels of the read transistor and the floating gate transistor.

19. A nonvolatile memory cell fabricated on a substrate, comprising:
 a high-voltage capacitor having a first diffusion region in the substrate;
 a high-voltage write path having at least a second diffusion region in the substrate; and
 a low-voltage read path having at least a third diffusion region in the substrate;
 wherein the second diffusion region is situated between the first diffusion region and the third diffusion region.

20. The nonvolatile memory cell of claim 19, further comprising a floating gate over the first diffusion region, the second diffusion region and the third diffusion region.

21. A nonvolatile memory cell fabricated on a substrate, comprising:
 a high-voltage capacitor on the substrate;
 a high-voltage write path on the substrate; and
 a low-voltage read path on the substrate;
 wherein the high-voltage write path is sandwiched between the high-voltage capacitor and the low-voltage read path.

22. The nonvolatile memory cell of claim 21, wherein the high-voltage capacitor is realized by a first diffusion region in the substrate, a first dielectric layer on the first diffusion region, and a first conductive plate on the first dielectric layer.

23. The nonvolatile memory cell of claim 22, wherein the high-voltage write path includes a tunnel capacitor and a write-line transistor serially connected to the tunnel capacitor.

24. The nonvolatile memory cell of claim 23, wherein the tunnel capacitor is realized by a second diffusion region in the substrate, a second dielectric layer on the second diffusion region and a second conductive plate on the second dielectric layer.

25. The nonvolatile memory cell of claim 24, wherein the second dielectric layer is thinner than the first dielectric layer and the second conductive plate is electrically connected to the first conductive plate.

26. The nonvolatile memory cell of claim 24, wherein the low-voltage read path includes a floating gate transistor and a read transistor serially connected to the floating gate transistor.

27. The nonvolatile memory cell of claim 26, wherein the floating gate transistor has a gate terminal and the gate terminal is electrically connected to the first and second conductive plates.

* * * * *